United States Patent
Howard et al.

(10) Patent No.: US 6,890,836 B2
(45) Date of Patent: May 10, 2005

(54) SCRIBE STREET WIDTH REDUCTION BY DEEP TRENCH AND SHALLOW SAW CUT

(75) Inventors: Gregory E. Howard, Dallas, TX (US); Leland S. Swanson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/445,163

(22) Filed: May 23, 2003

(65) Prior Publication Data

US 2004/0232524 A1 Nov. 25, 2004

(51) Int. Cl.⁷ .......................... H01L 21/00; H01L 21/44; H01L 2/46
(52) U.S. Cl. ........................ 438/460; 438/33; 438/68; 438/113; 438/458
(58) Field of Search .......................... 438/33, 68, 113, 438/458, 460, 462; 257/620

(56) References Cited

U.S. PATENT DOCUMENTS

| | | | | |
|---|---|---|---|---|
| 3,997,964 A | * | 12/1976 | Holbrook et al. | 438/463 |
| 4,961,821 A | * | 10/1990 | Drake et al. | 438/21 |
| 4,990,462 A | * | 2/1991 | Sliwa, Jr. | 438/107 |
| 5,185,292 A | * | 2/1993 | VanVonno et al. | 438/59 |
| 5,904,548 A | * | 5/1999 | Orcutt | 438/462 |
| 5,972,781 A | * | 10/1999 | Wegleiter et al. | 438/460 |
| 6,399,415 B1 | * | 6/2002 | Bayan et al. | 438/106 |
| 6,406,979 B2 | * | 6/2002 | Fischer et al. | 438/460 |
| 6,423,573 B1 | * | 7/2002 | Gidon | 438/113 |
| 6,448,153 B2 | * | 9/2002 | Siniaguine et al. | 438/460 |
| 6,593,170 B2 | * | 7/2003 | Tateiwa et al. | 438/114 |
| 6,649,445 B1 | * | 11/2003 | Qi et al. | 438/108 |
| 6,818,532 B2 | * | 11/2004 | Yeom et al. | 438/460 |
| 2001/0001215 A1 | * | 5/2001 | Siniaguine et al. | 257/618 |
| 2001/0041387 A1 | * | 11/2001 | Tateiwa et al. | 438/114 |
| 2002/0197826 A1 | * | 12/2002 | Kim et al. | 438/460 |
| 2003/0077878 A1 | * | 4/2003 | Kumar et al. | 438/460 |
| 2003/0100143 A1 | * | 5/2003 | Mulligan et al. | 438/113 |
| 2003/0104679 A1 | * | 6/2003 | Dias et al. | 438/462 |
| 2003/0143819 A1 | * | 7/2003 | Hedler et al. | 438/462 |
| 2003/0209772 A1 | * | 11/2003 | Prabhu | 257/434 |
| 2003/0232489 A1 | * | 12/2003 | Mizutani et al. | 438/460 |

FOREIGN PATENT DOCUMENTS

JP              404223356       *   8/1992

* cited by examiner

*Primary Examiner*—Craig A. Thompson
*Assistant Examiner*—James M. Mitchell
(74) *Attorney, Agent, or Firm*—Yingsheng Tung; Wade James Brady, III; Frederick J. Telecky, Jr.

(57) ABSTRACT

In a method to singulate a semiconductor wafer (100) into chips, trench streets (107) of predetermined depth (105a) are formed across the first, active wafer surface (102) to define the outline of the chips (101). Thereafter, the fabrication of the active first wafer surface is completed and protected. Then, the wafer is flipped to expose the second wafer surface (103), and the wafer is subjected to a cutting saw. The saw is aligned with the trenches in the first surface so that the saw cuts the second surface along streets (106), which extend the trenches through the wafer. The saw is stopped cutting at a depth (105b), when the saw streets just coalesce with the trench streets, respectively, whereby the chips are completely singulated.

10 Claims, 3 Drawing Sheets

SCRIBE STREET WIDTH REDUCTION BY DEEP TRENCH AND SHALLOW SAW CUT

FIELD OF THE INVENTION

The present invention is related in general to the field of semiconductor devices and more specifically to a method of dicing semiconductor wafers.

DESCRIPTION OF THE RELATED ART

With most semiconductor products, for example integrated circuits, transistors and diodes, a large number of elements are manufactured simultaneously on a large semiconductor wafer of silicon, gallium arsenide, gallium phosphide etc. The semiconductor industry employs the terms "singulation", "dicing technologies" or "scribing technologies" to refer to those techniques for obtaining a large number of functional chips from each semiconductor wafer. Two dicing methods are particularly well known in the art: the grinding-cutting method, using a blade or wire saw, and the scribing method, using a diamond point. Modern silicon technology prefers the cutting method using high-speed rotating blades. For reasons of mechanical stability at high rotating speeds, the blades have to possess a particular thickness, which cannot safely be reduced. When laying out the pattern of circuit chips on the surface of the semiconductor wafer, manufacturing efficiency requires that the distance between adjacent circuit chips be small so that the number of obtainable chips can be increased.

The technology of dicing has been developed to a high standard. Still, three restrictions exist with respect to the distance permissible between adjacent chips. The first restriction is the actual dicing width (for instance, thickness of the rotating blade), the second restriction is the degree of precision to which the cutting machine can be adjusted, and the third restriction is the cracks and chip-outs extending laterally from the dicing line into the semiconductor and insulating materials. In particular the third of these restrictions, namely the generation of cracks, creates the most significant limitation with respect to decreasing the distance between adjacent circuit chips. In addition, those cracks represent significant reliability risks, since they tend to grow and widen under thermal and mechanical stress and thus eventually imperil the functionality of the integrated circuit.

In typical processes, the scribe street for wafer sawing represents a space of about 50 to 70 $\mu$m between individual ships on a wafer. For a 200 mm wafer which is used for 1 mm$^2$ chips, the scribe streets will represent a total of around 12% of the wafer area. For logic chips, which can be as small as 200×600 $\mu$m$^2$, the scribe streets represent around 33% of the wafer.

A need has therefore arisen for an efficient, low cost and high yield method to drastically reduce the loss of semiconductor area lost to the scribe streets, and to eliminate the reliability hazards caused by the semiconductor chip-outs, particles and micro-cracks. The innovative method should use the installed equipment base so that no investment in new manufacturing machines is needed. The method should be flexible enough to be applied for different semiconductor materials and products, and should achieve improvements towards the goal of process reliability and handling simplification.

SUMMARY OF THE INVENTION

One embodiment of the invention is a method to singulate a semiconductor wafer into chips; the wafer has a first, active surface and an opposite second surface. Trench streets of predetermined depth are formed across the first wafer surface to define the outline of the chips. Thereafter, the fabrication of the active first wafer surface is completed and protected. Then, the wafer is flipped to expose the second wafer surface, and the wafer is subjected to a cutting saw. The saw is aligned with the trenches in the first surface so that the saw is cutting the second surface along streets which extend the trenches. The saw is stopped cutting when the saw streets just coalesce with the trench streets, respectively, whereby the chips have been completely singulated.

In another embodiment of the invention, a method is disclosed to singulate a semiconductor wafer with a first and a second surface into chips. In the first surface, the active semiconductor device is fabricated and a photomask is applied which permits consecutive etch steps for opening the bond pad windows into the protective overcoat and forming trench streets of predetermined depth in the semiconductor material. The active wafer surface is then protected, the wafer is flipped to expose the second surface, and subjected to a cutting saw. The saw is aligned with the trenches in the first surface so that the saw is cutting the second surface along streets which extend the trenches. The saw is stopped cutting when the saw streets just coalesce with the trench streets, respectively, whereby the chips have been completely singulated.

Embodiments of the invention are related to integrated circuit chips and to discrete device chips. The technical advantage of the invention to save valuable semiconductor real estate comes to bear progressively more, the smaller the chip area is. In addition, the reliability of the singulated chips is enhanced by the fact that the singulation of the active zone of the chip is achieved by etching (employing chemical or plasma techniques) and not by mechanical means such as sawing or scribing. Particles, chip-outs, and micro-cracks as deleterious side-effects of the singulation techniques are thus eliminated from the active zones of the chip.

It is a technical advantage of one or more embodiments of the invention that the embodiments can reach the goals of the invention with a low-cost manufacturing method without the cost of equipment changes and new capital investment, by using the installed fabrication equipment base, specifically the established wafer-fab etching techniques and automated sawing machines. Further, one or more embodiments of the invention can reach the goal of the invention without specific effort on aligning the etched trenches with the sawed streets, making the implementation of the invention in semiconductor manufacturing easy.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
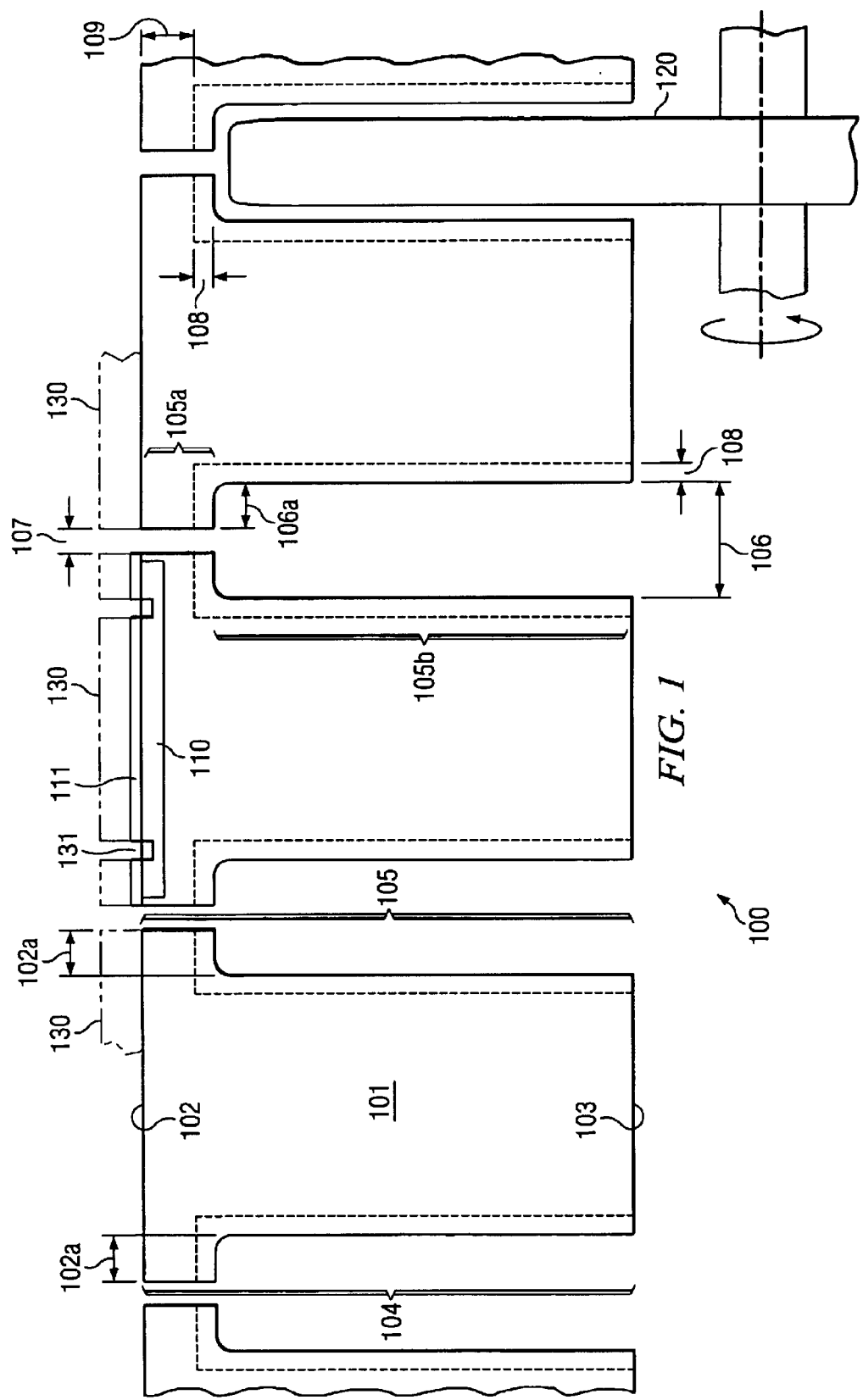
FIG. 1 is a schematic cross section through a portion of a semiconductor wafer indicating individual chips singulated by a method according to the invention.

FIG. 1 illustrates schematically the cross section of a portion of a semiconductor wafer, generally designated 100, which has been singulated into a plurality of semiconductor chips 101. The vertical dimension of the wafer has been expanded in FIG. 1 for clarity. The semiconductor material of the wafer may be silicon, silicon germanium, germanium, gallium arsenide, aluminum gallium phosphide, indium phosphide, gallium phosphide, or any other semiconductor material used for fabricating semiconductor devices. Each chip 101 is in principle a cuboid, which has a top surface 102, a bottom surface 103, and four vertical side surfaces, of which only two surfaces 104 and 105 are indicated in FIG. 1. The top surface 102 includes the active electronic device 110, which may for some wafers include an integrated circuit, for other wafers a discreet device such as a diode, especially a light-emitting diode, or a controlled rectifier, or a power transistor. The bottom surface 103 is the passive surface of the chip.

The top surface 102 includes a perimeter 102a of approximately rectangular cross section, which protrudes beyond the four edge sides 105. The chip thus exhibits an annulus-shaped protrusion attached to the top portion of the chip. Consequently, the top surface 102 has a larger area than the area of the bottom surface 103. This increase of the top surface becomes relatively more significant, the smaller the chip area is. The complete enlarged top surface 102 is available to be used for features of the semiconductor device, a significant increase in semiconductor area available for device purposes compared to the area without the annulus-shaped protrusion.

The edge side 105 comprises portion 105a of the annulus-shaped protrusion, and portion 105b, which is usually larger than portion 105a. Portion 105a of the edge side 105 is created by etching, preferably by plasma etching, although some embodiments employ chemical etching. This etching process starts at surface 102 and progresses into the semiconductor material to the depth 105a, creating a trench of width 107. These etching processes produce no microcracks, which would otherwise stretch from the freshly created surface into the semiconductor material.

Depth 105a and width 107 of the trench are correlated by the aspect ratio depth-to-width, which is achievable by the selected etching technique. For plasma etching technology, the aspect ratio is preferably 8:1 or less (such as 6:1 or 4:1). As an example, a trench depth of 20 $\mu$m would require a trench width of approximately 2 to 3 $\mu$. For shallower trenches, a trench width of about 1 $\mu$m or even 0.5 $\mu$m is achievable.

Portion 105b is created by mechanical sawing, preferably by a rotating blade 120 (a portion of the blade is schematically shown in FIG. 1 still inserted in one of the freshly cut streets), after the etched trenches have been created. The sawing operation creates a saw "street" of width 106, determined by the width of the saw blade. In order to cut each saw street, the saw is aligned with the respective trench so that the saw street will be able to coalesce with the respective trench. Where the saw street 106 merges with the etched trench 107, the saw street forms ridges 106a.

Advanced blades, commercially available for instance from Disco Corporation, Japan, may be as narrow as 25 $\mu$m. They create a street of approximately 50 $\mu$m width. Somewhat wider saw streets of about 60 $\mu$m width and more can be conveniently achieved. At the tip, the saws are typically about rectangular with some rounding; the surface of the blades is covered with diamond grit, especially at the blade tip. Due to the nature of the mechanical sawing operation, the saw street is surrounded by a semiconductor zone afflicted by microcracks. These microcracks originate at the surface, which is freshly created by the sawing operation, and stretch into the semiconductor material. In FIG. 1, this microcrack-disturbed zone is designated 108. Using modern saws, zone 108 is in the range from about 4 to 6 $\mu$m, at most 10 to 12 $\mu$m. As for the sidewalls of etched trench 107, they retain a microcrack-free zone 109 from the original trench etching process, but lose a zone of width 108 to the microcrack-affected zone after the sawing operation.

The street width can be narrowed, though, by employing "dicing lasers". Using this technology, a width of about 30 $\mu$m is possible. In addition, any microcrack-disturbed zone is narrower.

Figure 2:
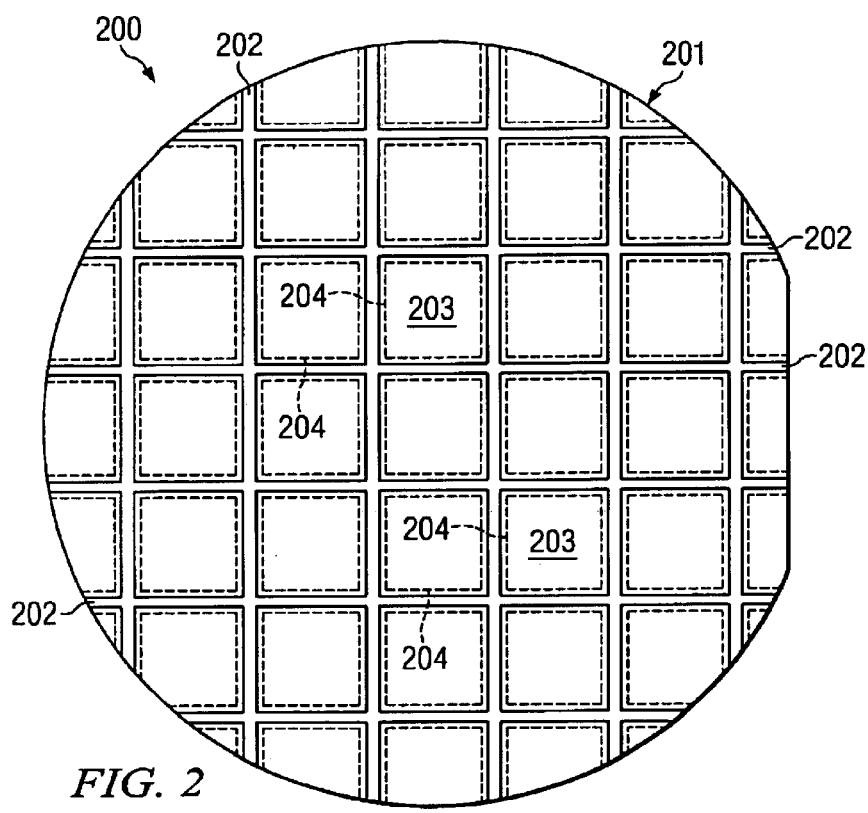
FIG. 2 is a schematic top view of a semiconductor wafer after chips have been singulated according to an embodiment of the invention.

In FIG. 2, a semiconductor wafer, generally designated 200, is schematically illustrated in top view of the first, or active, surface 201. The line A–A' in FIG. 2 is an example, where the cross section of FIG. 1 may be taken.

In one embodiment of the invention, the method to singulate this semiconductor wafer 200 into individual chips 203 comprises the following steps:

forming trench streets 202 of predetermined depth across the first wafer surface 201 to define the outline of the chips 203. In customary fashion, these chips are rectangular, in some instances square. Consequently, the trenches are formed by two pluralities of trenches; within each plurality, the trenches are parallel; relative to each other, the two pluralities are at right angles. Preferably, the trenches are cut by plasma etching or chemical etching. Both techniques allow batch processing;

optionally, filling the trenches with an oxide such as silicon dioxide; a preferred technique is low pressure chemical vapor deposition (in FIG. 1, the trench of depth 105a would be completely filled with oxide before the fabrication of the electronic device 110 starts);

completing the fabrication of the first wafer surface 201 by building the electronic device. The device may be an integrated circuit or a discrete device. The active surface 201 is protected by a protective overcoat such as silicon nitride or silicon oxynitride (shown in cross section in FIG. 1, designated 111);

removing the oxide from the trenches after the electronic device has been built on active surface 201 (in FIG. 1, the trench of depth 105a is open again). This step is only necessary for wafers where the trenches have been filled with an oxide;

protecting the whole first wafer surface with a plastic film, which can be easily removed after completion of the sawing operation;

flipping the wafer to expose the second, passive, wafer surface (not shown in FIG. 2);

submitting the wafer to a wafer-cutting saw equipment;

aligning the saw consecutively with each trench in the first surface so that the saw cuts the second surface along streets which extend the trenches, respectively; the saw streets 204 are indicated by dashed lines in FIG. 2; and stopping each saw cutting when the saw street just coalesces with the trench street, respectively, whereby the chips are completely singulated.

A number of techniques are available to perform the required alignment of the mechanical saw with the etched trenches before cutting the each individual street. In a preferred approach, the protective film over the first/active wafer surface is transparent in the wavelength range of visible light. In addition, the flexible tape, which supports the wafer during the sawing operation (customarily referred to as the "blue tape"), is transparent in the wavelength range of visible light. After the wafer has been flipped onto the support tape, a camera from the bottom can clearly observe the location of the etched trenches in the first surface. The saw comes in from the top onto the second/passive wafer surface and is computer-controlled by the camera from the bottom. For process control purposes, each completed saw street can be monitored by an operator together with the respective etched trench.

Another approach uses infrared alignment equipment, wherein infrared light shines through the semiconductor wafer material to observe the trench locations. The saw is then computer-controlled by the camera operating in the infrared light regime.

In another embodiment of the invention, the method to singulate the semiconductor wafer 200 into individual chips 203 comprises the following steps:

fabricating electronic devices in the active first wafer surface 201. The devices may be integrated circuits or discreet devices. The active surface 201 is protected by a protective overcoat such as silicon nitride, silicon oxynitride, silicon carbide, or a combination thereof;

applying a photomask (a photomask portion 130 is schematically shown in the cross section of FIG. 1; the photomask is illustrated in dashed lines, since it is already removed at the process step of chip singulation, which is depicted in FIG. 1). The photomask permits consecutive etch steps, first for opening the bond pad windows into the protective overcoat (131 in FIG. 1), and then for forming trench streets 202 of predetermined depth in the semiconductor material (width 107 and depth 105a in FIG. 1).

protecting the first/active wafer surface 201 with a plastic film, which can be easily removed after completion of the sawing operation;

flipping the wafer to expose the second wafer surface (not shown in FIG. 2);

submitting the wafer to a wafer-cutting saw equipment;

aligning the saw consecutively with each trench in the first surface so that the saw is cutting the second surface along streets which extend the trenches, respectively; the saw streets are indicated by dashed lines in FIG. 2; and stopping the saw cutting when the saw streets just coalesce with the trench streets, respectively, whereby the chips are completely singulated.

In both embodiments described above, the chip singulation on the active, device-bearing surface is accomplished by the narrow etched trench. The electronic device can, therefore, take full advantage of the enlarged area available for the layout of that device, compared with the sacrifice of semiconductor material in connection with mechanical saws. Equally important, any disturbing chipped-out particles or nascent microcracks are kept at safe distance from the electronic device. Particles and microcracks are unavoidable side-effects of mechanical saws. The electronic device can, therefore, take full advantage of the reduced risk of failure mechanisms and thus enhanced reliability expectation.

In another embodiment of the invention, the use of a mechanical saw is avoided altogether; instead, the wafer is subjected to a semiconductor material-removing step such as thinning by back-grinding, in order to complete the singulation of the chips from the wafer. The method to singulate the semiconductor wafer into individual chips comprises the following steps:

fabricating electronic devices in the first wafer surface. The devices may be integrated circuits or discreet devices. The first surface is protected by a protective overcoat;

applying a photomask which permits consecutive etch steps for opening first the bond pad windows into the protective overcoat, then forming trench streets of a depth equal to the intended thickness of the chips. In this embodiment, the trench streets may have to be etched deeper than in the previously described embodiments, since the trench streets have to penetrate the whole depth of the intended final wafer thickness;

protecting the first wafer surface with a plastic film, which can be easily removed after completion of the singulating process;

flipping the wafer to expose the second wafer surface;

submitting the wafer to a wafer-thinning apparatus. The preferred technique is mechanical back-grinding because of its installed equipment base, high wafer throughput, and low cost. Suitable back-grinding machines are commercially available for example from the companies Disco, TSK, and Okamoto, all of Japan. However, there are several other proven techniques: chemical spin etching; chemical/mechanical wet polishing; and plasma dry etching. From the standpoint of mechanical strength, low stress, minimal mechanical and thermal damage of the singulated chips, chemical etching is the preferred method. From the standpoint of future workability (for instance, extremely thin chips), plasma etching is the preferred method;

removing material from the wafer, starting from the second surface, until the trench streets are just reached; and stopping the removal process, whereafter the chips are completely singulated.

In another embodiment of the invention, which avoids the use of a mechanical saw, a material-removing step such as thinning by back-grinding is employed in order to complete the singulation of the chips from the wafer. The method comprises the following steps: forming trench streets of pre-determined depth across the first wafer surface to define the outline of the chips;

completing the fabrication of the first wafer surface by building the electronic device; the device may be an integrated circuit or a discrete device;

protecting the first wafer surface with a thin film, which can easily be removed after the completion of the singulation process. The wafer is then flipped to expose the second wafer surface; and removing semiconductor material from the second wafer surface, for example by a grinding or an etching technique. The removing process continues until the trench streets are just reached, at which time the material-removing process is stopped and the chips are completely singulated.

Figure 3:
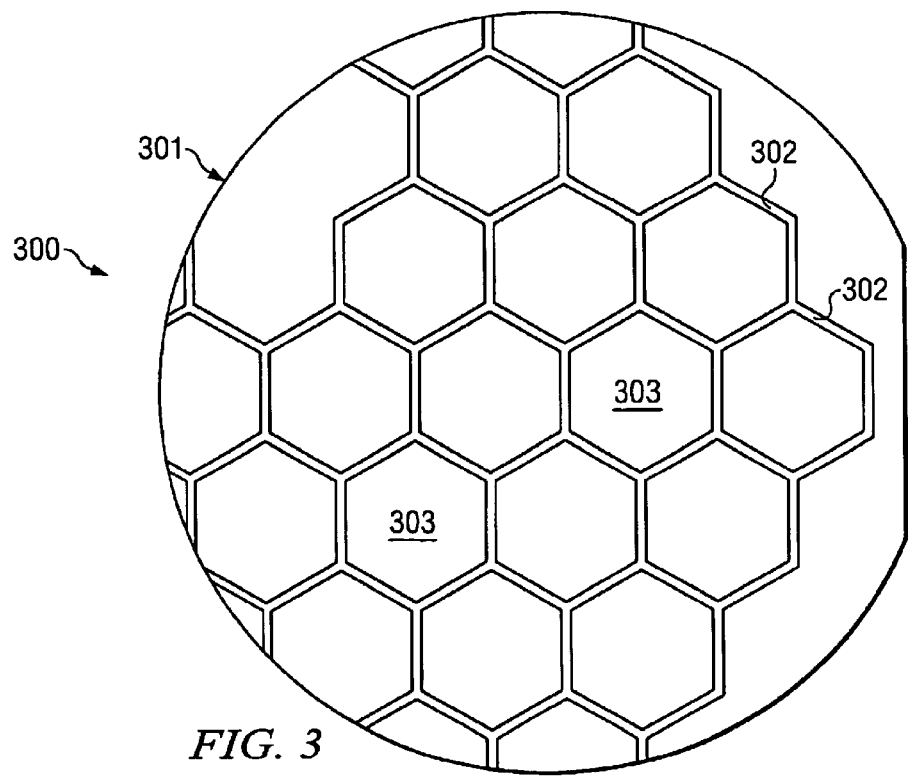
FIG. 3 is a schematic top view of a semiconductor wafer after chips have been singulated according to another embodiment of the invention.
Figure 4:
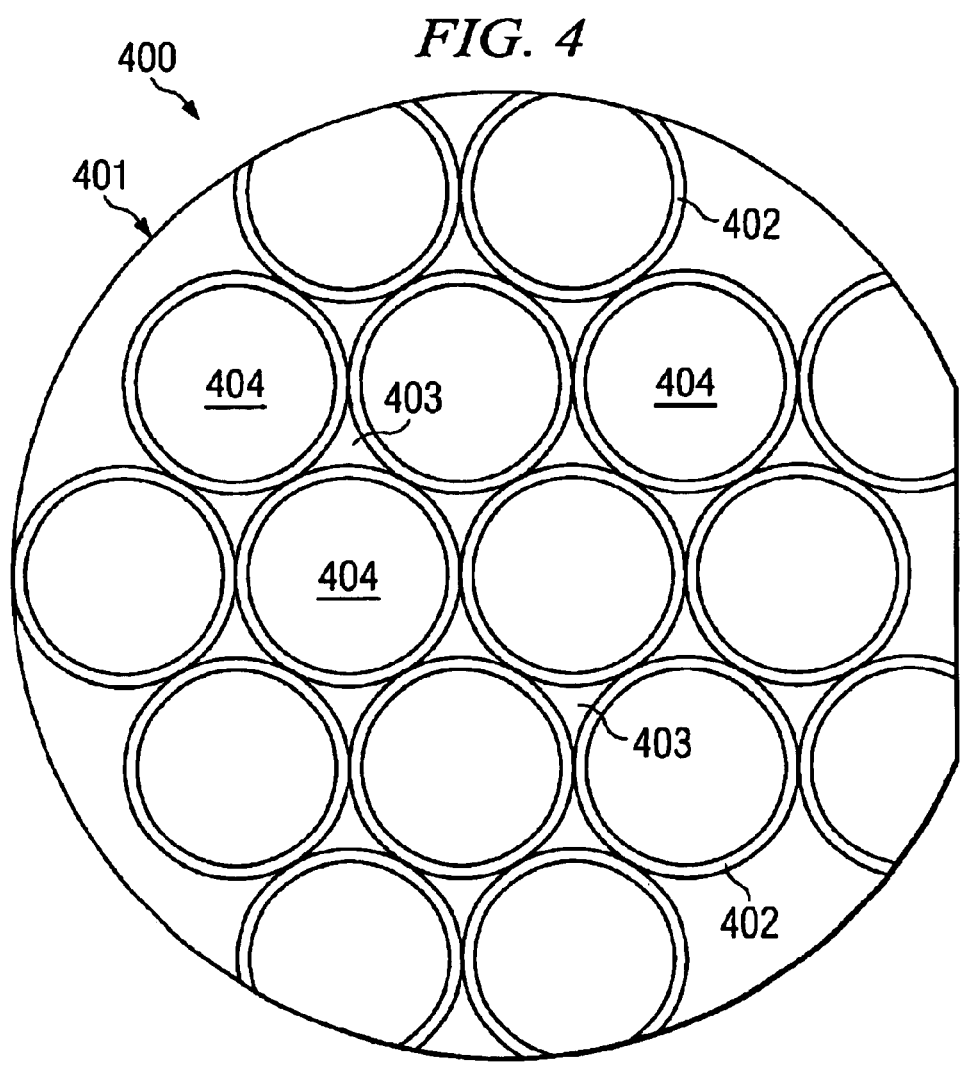
FIG. 4 is a schematic top view of a semiconductor wafer after chips have been singulated according to another embodiment of the invention.

When any one of the thinning techniques listed above are employed rather than sawing, the trench streets-to-be-etched can be selected so that the outline of the chips are different from the conventional rectangular or square shape. Examples are hexagonal shape, as illustrated in FIG. 3, and circular shape, as illustrated in FIG. 4. In the unconventional hexagonal shape, the chip side angles are larger than 90°. In a circular chip, there are no more corners. Chips with these unconventional outlines offer a significant technical advantage, because they avoid the sharp peaks of thermo-mechanical stress, which appear in electronic device features near the conventional 90° side angles of conventional rectangular chips. The absence of these stresses is a significant advantage for chips of very thin thickness (such as 20 to 50 μm).

As an example of these embodiments of the invention, a semiconductor wafer, generally designated 300, is schematically illustrated in FIG. 3 in top view of the first, or active surface 301. Following one of the singulation methods described above in conjunction with FIG. 2, trench streets 302 of hexagonal outline and predetermined depth are etched deep into the first wafer surface 301. The etched streets are at least as deep as the final wafer thickness in order to insure complete chip singulation. As an example, the street depth may be between 20 and 50 μm. As an example, each chip 303 includes an integrated circuit. As another example, each chip 303 is a discrete electronic device such as a light-emitting diode, or a controlled rectifier, or a power transistor.

As another example of these embodiments of the invention, a semiconductor wafer, generally designated 400, is schematically illustrated in FIG. 4 in top view of the first, or active surface 401. Applying one of the singulation methods described above in conjunction with FIG. 2, trench streets 402 of circular outline and predetermined depth are etched deep into the first wafer surface 401. The etched streets are at least as deep as the final wafer thickness in order to insure complete chip singulation. For instance, the street depth may be between 20 and 50 μm. Each chip 404 may include, for instance, an integrated circuit. In other wafers, each chip 404 may be a discreet electronic device such as a light-emitting diode, a rectifier, or a power transistor. As FIG. 4 shows, between the circular-shaped chips 404 remain left-over areas 403. These areas 403 can be put to good purpose during the device fabrication process, for instance to accommodate test structures, metrology structures, process control monitors and similar functions essential for achieving high fabrication yield. As another example, the small area 404 include electronic devices requiring only little area, such as a sensor.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method to singulate a semiconductor wafer into electronic-device chips, said wafer having a wafer thickness, a first, active surface and an opposite second surface, comprising the steps of:

forming first trench streets of a first trench width and a first depth less than the wafer thickness across said first wafer surface to define the outline of said chips;

protecting said active first wafer surface, flipping said wafer to expose said second wafer surface; and subjecting said wafer to a wafer-cutting saw so that said saw cuts said second surface along the first trench streets to form second trench streets of a second trench width and a second depth less than the wafer thickness to singulate the semiconductor wafer into chips, the sum of the first depth and the second depth not less than the wafer thickness.

2. The method according to claim 1 further comprising the step of stopping said saw cutting when the second trench streets just coalesce with the first trench streets, respectively, whereby said chips are completely singulated.

3. The method according to claim 1 wherein said first depth is 2 μm or more and a the first width is between about 0.5 and 10 μm.

4. The method according to claim 1 wherein said trenches are formed by plasma etching.

5. The method according to claim 1 further comprising, after the step of forming said trench streets, the step of completing the fabrication of the electronic device on said active first wafer surface.

6. The method according to claim 5 further comprising the steps of filling said trenches with an oxide before said electronic device fabrication.

7. The method according to claim 6 further comprising the step of removing said oxide from said trenches after completing said active surface fabrication.

8. The method according to claim 6 wherein said oxide is created by low pressure chemical vapor deposition.

9. The method according to claim 5 wherein said active surface includes an integrated circuit.

10. The method according to claim 5 wherein said active surface includes a discrete device.

* * * * *